United States Patent
Leu et al.

(10) Patent No.: US 6,652,912 B2
(45) Date of Patent: Nov. 25, 2003

(54) METHOD AND SYSTEM FOR SPRAYING A VISCOUS MATERIAL ON A WAFER

(75) Inventors: Ren-Jyh Leu, Taipei (TW); Hung-Chih Chen, Hsin-Chu (TW); Kun I Lee, Sanchung (TW); Bao Ru Young, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 263 days.

(21) Appl. No.: 09/928,045

(22) Filed: Aug. 10, 2001

(65) Prior Publication Data

US 2003/0031800 A1 Feb. 13, 2003

(51) Int. Cl.⁷ .................................................. B05D 1/02
(52) U.S. Cl. ........................ 427/240; 427/421; 427/425; 427/427; 438/758; 438/780; 438/782; 438/787; 118/52; 118/300; 118/320
(58) Field of Search .................................. 427/240, 425, 427/421, 427; 118/52, 300, 320; 438/758, 780, 782, 787

(56) References Cited

U.S. PATENT DOCUMENTS

| 5,294,459 A | * | 3/1994 | Hogan et al. ................. 427/96 |
| 5,316,219 A | * | 5/1994 | Christyson et al. ...... 239/533.1 |
| 5,913,981 A | * | 6/1999 | Florez ........................... 134/3 |

* cited by examiner

*Primary Examiner*—Shrive P. Beck
*Assistant Examiner*—Kirsten Crockford Jolley
(74) *Attorney, Agent, or Firm*—Tung & Associates

(57) ABSTRACT

This invention discloses a novel design to obtain a good coating uniformity and to reduce the volume of viscous materials when coating by spraying the viscous material on the wafer during the first time period at a first predetermined pressures; spraying the viscous material on the wafer at a second predetermined pressure in response to the end of the first time period, the second predetermined pressure being lower than the first predetermined pressure; and spraying the viscous material on the wafer during a second time period at a time-varying pressure, the time-varying pressure being increased from the second predetermined pressure to a third predetermined pressure during the second time period.

14 Claims, 2 Drawing Sheets

METHOD AND SYSTEM FOR SPRAYING A VISCOUS MATERIAL ON A WAFER

FIELD OF THE INVENTION

The present invention relates to a method and system for spraying a viscous material on a wafer, and more particularly to a method and system for spraying a viscous material on a wafer to increase the uniformity of the viscous material coating on a wafer.

BACKGROUND OF THE INVENTION

Because of the competition, the cost of manufacturing is very critical to semiconductor manufacturing industry. Because most viscous materials, such as photoresist, SOG, and spin-on polymers, e.g. SILK and FLARE®, are very expensive and most of them will be spun out of the surface of the wafer when coating, if the volume of these materials can be reduced, the manufacturing cost also will be effectively reduced. Furthermore, the coating uniformity is also very critical for a semiconductor manufacturing process. Therefore, it is a goal for semiconductor manufacturing industry to keep the coating uniformity and to reduce the volume of usage of these viscous materials simultaneously.

Take photoresist as an example. Conventionally, a pump delivers photoresist to a nozzle at a fixed pressure to spray the photoresist on a wafer. See FIG. 1. The major drawback of this prior art method is that the volume of photoresist would be too much. For example, when using TOK® IP-3100 as a coating material, if the standard deviation of the photoresist thickness coated on a wafer is 13 A, the volume is 2.5 cc.

To alleviate this drawback, another prior art method (shown in FIG. 2) was proposed. In FIG. 2, the pumping pressure is fixed in an initial predetermined period and then reduced linearly in response to the end of the initial predetermined period. Although using this method would reduce the volume of photoresist used, the coating uniformity would be affected severely. For example, when using TOK® IP-3100 as a coating material, the volume is reduced to 1.5 cc, but the standard deviation of the photoresist thickness coated on a wafer is increased to 30 Å. FIG. 3 shows the standard deviation diagram in accordance with the prior art method (FIG. 2) using TOK® IP-3100 as a coating material.

Still another prior art method to reduce the volume of the photoresist used is to pre-wet the surface of the wafer with a solvent before coating for reducing the surface tension of the wafer, thereby reducing the volume of the photoresist. However, while the method reduces the volume of photoresist used, the coating uniformity cannot be improved effectively.

Hence, how to maintain the coating uniformity requirement and to reduce the volume of usage of these viscous materials simultaneously is very important for the semiconductor manufacturing industry.

When viscous materials are coated on a wafer, a nozzle sprays the materials at the center of the wafer. By spinning the wafer, the viscous materials will be delivered to the perimeter of the wafer. Because highly volatile solvents are usually added to these viscous materials before coating, the proportion of solvents in these coating materials at the center of the wafer is higher than that on the other area of the wafer. When these viscous materials are delivered by spinning, the proportion of solvents decreases because of volatility. Hence, the proportion of the viscous materials along the periphery of the wafer is higher than that at the center of the wafer. After a time period, the thickness of these materials is highest along the periphery than thickness at the center of the wafer, which forms a dish shape. When the volume of these coating materials used is large, the dishing phenomenon is not serious. However, if one wants to reduce the volume of these coating materials for cost reason, the dishing phenomenon becomes more of a concern. However, if these materials can be uniformly delivered to the periphery of the wafer, not only the volume of these coating materials can be reduced, but also coating uniformity can be effectively improved.

SUMMARY OF THE INVENTION

It is therefore an object of the present invention to provide a cost-effective method and system to obtain a good coating uniformity.

It is another object of the present invention to provide a cost-effective method and system to reduce the volume of viscous materials used when coating.

In order to overcome the shortcomings mentioned above, the present invention discloses a method and system for spraying a viscous material on a wafer, not only to keep the coating uniformity requirement but also to reduce the volume of usage of these viscous materials simultaneously.

In accordance with one embodiment of the present invention, a method for spraying a viscous material on a wafer is provided which includes the steps of: spraying the viscous material on the wafer during a first time period at a first predetermined pressure; spraying the viscous material on the wafer at a second predetermined pressure after the first time period, the second predetermined pressure being lower than the first predetermined pressure; and spraying the viscous material on the wafer during a second time period at a time-varying pressure, the time-varying pressure being increased from the second predetermined pressure to a third predetermined pressure during the second time period.

In accordance with another embodiment of the present invention, a spraying system for spraying a viscous material on a wafer is provided which includes a nozzle for spraying the viscous material on the wafer; a pump, coupled to the nozzle; and a controller coupled to the pump; the controller controlling the pump to pump the viscous material during a first time period at a first predetermined pressure; the controller being responsive to the end of the first time period for controlling the pump to deliver the viscous material during a second time period at a time-varying pressure; wherein the time-varying pressure is increased from a second predetermined pressure to a third predetermined pressure during the second time period, and the second predetermined pressure is lower than the first predetermined pressure.

A further understanding of the nature and advantages of the present invention may be realized by reference to the remaining portions of the specification and the drawings.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a new method and system to improve the coating uniformity while reducing the volume of usage of these coating materials. The following description discloses the present invention in details by using a photoresist material as an example. The present invention can also be utilized on other viscous materials, such as, but not limited to, spin-on glass (SOG), spin-on polymers (e.g., SILK® and FLARE®,)

Figure 4:
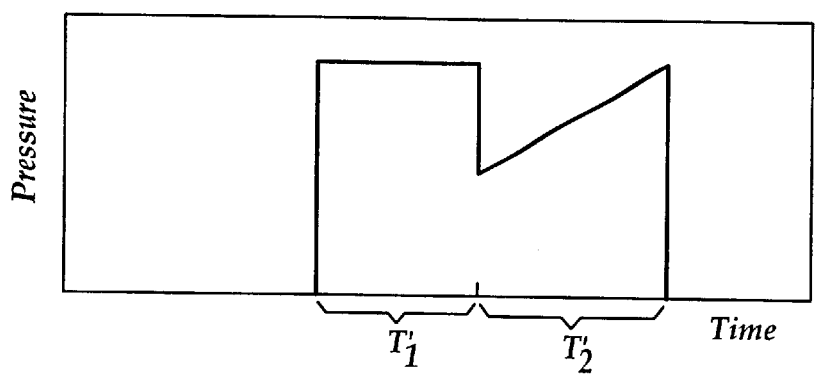
FIG. 4 shows the pumping pressure-time diagram in accordance with one embodiment of the present invention.
Figure 5:
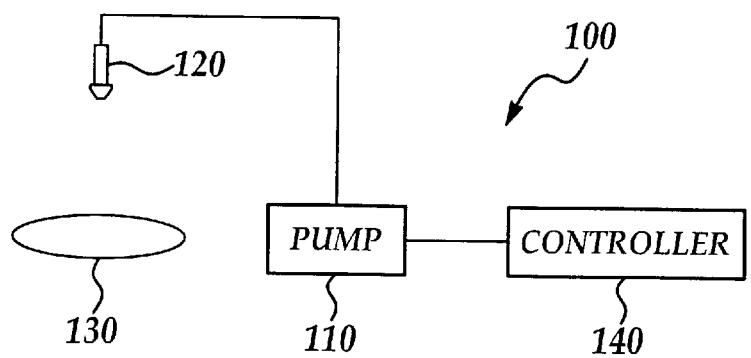
FIG. 5 shows a spraying system for spraying photoresist on a wafer in accordance with one embodiment of the present invention.

FIG. 4 shows the pumping pressure-time diagram in accordance with one specific embodiment of the present invention. FIG. 5 shows a spraying system 100 for spraying photoresist on a wafer in accordance with one specific embodiment of the present invention. In accordance with the specific embodiment of the present invention, a controller 140 is coupled to pump 100 for controlling pump 110 to deliver photoresist. Pump 110, coupled to nozzle 120, is used for pumping photoresist to nozzle 120. During a first time period, controller 140 controls pump 110 to deliver photoresist at a first predetermined pressure. Responsive to the end of the first time period, controller 140 controls pump 110 to quickly reduce the pressure to a second predetermined pressure. Because of the quick reduction of the pressure the amount of photoresist is rapidly reduced at the center of wafer 130 such that solvents at the center of the wafer will be more easily volatilized. Hence, the photoresist at the center of wafer 130 becomes "harder", i.e. dryer.

Figure 1:
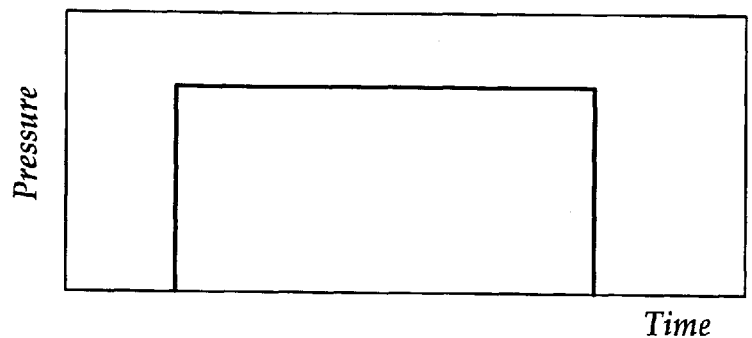
FIG. 1 shows a prior art pumping pressure-time diagram.
Figure 2:
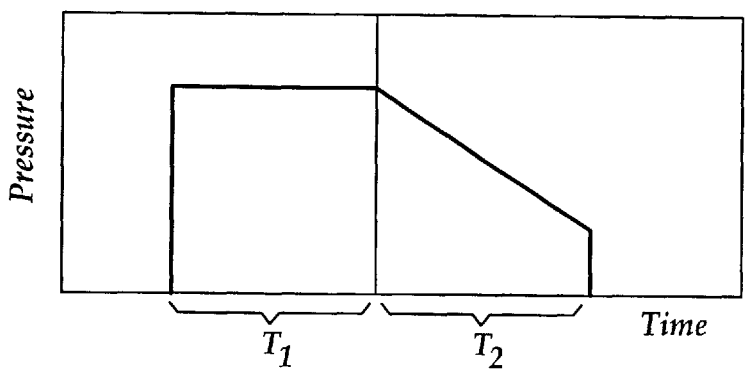
FIG. 2 shows another prior art pumping pressure-time diagram.
Figure 3:
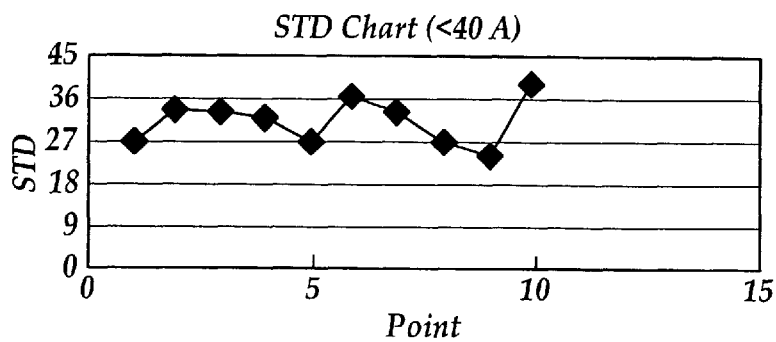
FIG. 3 shows the standard deviation of the photoresist coating uniformity in accordance with pumping pressure-time diagram shown in FIG. 2.
Figure 6:
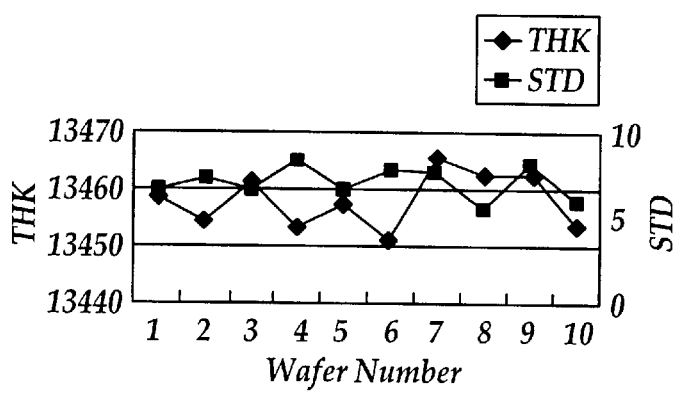
FIG. 6 shows the standard deviation of the photoresist coating uniformity in accordance with one embodiment of the present invention.

After reducing to the second predetermined pressure, controller 140 controls pump 110 to deliver photoresist during a second time period at a time-varying pressure; wherein the time-varying pressure is increased from the second predetermined pressure to a third predetermined pressure during the second time period. For example, the time-varying pressure can be, but not limited to, increased linearly, steps, or in combination of both, from 5 psi to 10 psi in 0.8 sec. As aforementioned, the photoresist deposited at the center of wafer 130 becomes dryer because of the quick reduction of the pressure. Hence, solvents contained in the photoresist sprayed and deposited during the second time period would not be "trapped" at the center of wafer 130 due to higher proportion of solvents at the center of wafer 130, and thus easier to be delivered to the periphery of wafer 130. Accordingly, the solvents would be more likely to be delivered to the periphery of wafer 130 before volatilization so that the thickness of the photoresist at the periphery of wafer 130 is closer to that at the center of wafer 130; hence, the dishing phenomenon is substantially eliminated. FIG. 6 shows the standard deviation of photoresist TOK® IP-3100 coating thickness using pumping pressure shown in FIG. 4 in accordance with a specific embodiment of the present invention. Referring to FIG. 6, the standard deviation is only 7–8 Å instead of 30 Å shown in FIG. 3. Furthermore, the volume of photoresist used for coating is reduced to 0.9 cc~1.2 cc.

In accordance with one specific embodiment of the present invention shown in FIG. 4, the pump is a stepless variable pressure pump. In accordance with this specific embodiment of the present invention, the time-varying pressure is linearly increased from the second predetermined pressure to a third predetermined pressure during the second time period. For example, the time-varying pressure is linearly increased from 5 psi to 10 psi in 0.8 sec. The linear stops, the value of the second and the third predetermined pressure can be fine-tuned according to the viscosity of the photoresist. For example, the third predetermined pressure can be substantially equal to, lower than or higher than the first predetermined pressure according to the viscosity of the photoresist. The term "substantially equal to" used in this writing indicates a range of values that is ±5% of the average value given.

Figure 7:
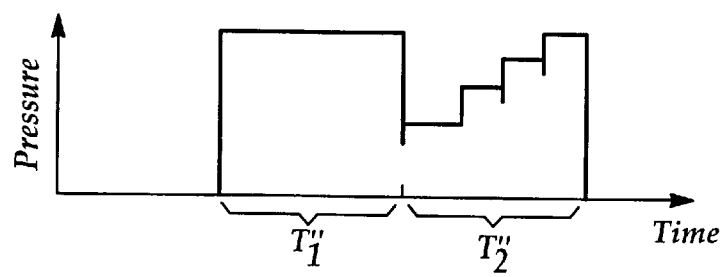
FIG. 7 shows the pumping pressure-time diagram in accordance with another embodiment of the present invention.

In addition to the stepless variable pressure pump, the present invention can also be utilized incorporating a stepper pump. FIG. 7 shows the pumping pressure-time diagram in accordance with another embodiment of the present invention. The principle is substantially the same as shown in the previous embodiment of the present invention. The only difference is that the time-varying pressure is step-increased from the second predetermined pressure to the third predetermined pressure during the second time period (e.g. the time-varying pressure is step-increased from 5 psi to 10 psi in 0.8 sec.), such that a detail description is not repeated here.

The invention has ben described in several particular embodiments thereof. Accordingly, the above description and illustrations should not be construed as limiting the scope of the invention. Various changes and modifications, such as the step of fine-tuning the linear slope, the spraying time and the pumping pressure by using other equivalent apparatus, or applying the present invention method to different viscous materials for coating purpose, may be made by those skilled in the art without changing the scope or spirit of the invention which is defined by the following claims.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for spraying a viscous material on a wafer, comprising the steps of:
   spraying said viscous material on said wafer during a first time period at a first predetermined pressure;
   spraying said viscous material on said wafer during a second time period at a second predetermined pressure subsequent to said first time period, said second predetermined pressure being lower than said first predetermined pressure; and
   spraying said viscous material on said wafer during a third time period at a time-varying pressure being increased from said second predetermined pressure to a third predetermined pressure during said third time period.

2. The method of claim 1, wherein said viscous material is a material selected from the group consisting of a photoresist material, spin-on glass and spin-on polymer.

3. The method of claim 1, wherein said time-varying pressure is linearly increased from said second predetermined pressure to said third predetermined pressure during said third time period.

4. The method of claim 1, wherein said time-varying pressure is step-increased from said second predetermined pressure to said third predetermined pressure during said third time period.

5. The method of claim 1, wherein said third predetermined pressure is substantially equal to said first predetermined pressure.

6. The method of claim 1, wherein said third predetermined pressure is lower than said first predetermined pressure.

7. The method of claim 1, wherein said third predetermined pressure is higher than said first predetermined pressure.

8. A method for spraying a viscous material on a wafer, comprising the steps of:

spraying said viscous material on said wafer during a first time period at a first predetermined pressure;

spraying said viscous material on said wafer during a second time period at a time-varying pressure subsequent to said first time period; and wherein said time-varying pressure increases from a second predetermined pressure to a third predetermined pressure during said second time period, wherein second predetermined pressure is lower than said first predetermined pressure.

9. The method of claim 8, wherein said viscous material is a material selected from the group consisting of a photoresist material, spin-on glass and spin-on polymer.

10. The method of claim 8, wherein said time-varying pressure is linearly increased from said second predetermined pressure to said third predetermined pressure during said second time period.

11. The method of claim 8, wherein said time-varying pressure is step-increased from said second predetermined pressure to said third predetermined pressure during said second time period.

12. The method of claim 8, wherein said third predetermined pressure is substantially equal to said first-predetermined pressure.

13. The method of claim 8, wherein said third predetermined pressure is lower than said first predetermined pressure.

14. The method of claim 8, wherein said third predetermined pressure is higher than said first predetermined pressure.

* * * * *